(12) United States Patent
Yang et al.

(10) Patent No.: US 7,683,435 B2
(45) Date of Patent: Mar. 23, 2010

(54) MISALIGNMENT-TOLERANT MULTIPLEXING/DEMULTIPLEXING ARCHITECTURES

(75) Inventors: Xiaofeng Yang, Corvallis, OR (US); Sriram Ramamoorthi, Corvallis, OR (US); Galen H. Kawamoto, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 225 days.

(21) Appl. No.: 10/836,145

(22) Filed: Apr. 30, 2004

(65) Prior Publication Data

US 2005/0242404 A1 Nov. 3, 2005

(51) Int. Cl.
*H01L 27/04* (2006.01)

(52) U.S. Cl. .................. 257/390; 257/E27.07

(58) Field of Classification Search ........... 257/390, 257/202, 211, E27.07; 365/230.02, 189.02, 365/185.05
See application file for complete search history.

(56) References Cited

U.S. PATENT DOCUMENTS

| | | | |
|---|---|---|---|
| 2,744,970 A | 5/1956 | Shockley | |
| 2,939,057 A | 5/1960 | Tezner | |
| 3,964,296 A | 6/1976 | Matzuk | |
| 5,008,616 A | 4/1991 | Lauks et al. | |
| 5,118,801 A | 6/1992 | Lizardi et al. | |
| 5,132,278 A | 7/1992 | Stevens et al. | |
| 5,202,290 A | 4/1993 | Moskovits | |
| 5,237,523 A | 8/1993 | Bonne et al. | |
| 5,330,612 A | 7/1994 | Watanabe | |
| 5,376,755 A | 12/1994 | Negm et al. | |
| 5,418,558 A | 5/1995 | Hock et al. | |
| 5,475,341 A | 12/1995 | Reed | |
| 5,493,167 A | 2/1996 | Mikol et al. | |
| 5,591,896 A | 1/1997 | Lin | |
| 5,622,825 A | 4/1997 | Law et al. | |
| 5,747,180 A | 5/1998 | Miller et al. | |
| 5,767,521 A | 6/1998 | Takeno et al. | |
| 5,772,905 A | 6/1998 | Chou | |
| 5,780,710 A | 7/1998 | Murase et al. | |
| 5,801,124 A | 9/1998 | Gamble et al. | |
| 5,837,454 A | 11/1998 | Cozzette et al. | |
| 5,837,466 A | 11/1998 | Lane et al. | |
| 5,843,653 A | 12/1998 | Gold et al. | |
| 5,869,244 A | 2/1999 | Martin et al. | |
| 5,918,110 A | 6/1999 | Abraham-Fuchs et al. | |
| 5,972,710 A | 10/1999 | Weigl et al. | |
| 5,997,958 A | 12/1999 | Sato et al. | |
| 6,034,389 A | 3/2000 | Burns, Jr. et al. | |
| 6,120,844 A | 9/2000 | Chen et al. | |
| 6,150,097 A | 11/2000 | Tyagl et al. | |

(Continued)

OTHER PUBLICATIONS

Choi, et al.; "Sublighographic nanofabrication technology for nanocatalysts and DNA Chips"; J. Vac. Sci. Technol. B21(6) Nov./Dec. 2003; pp. 2951-2955.

(Continued)

*Primary Examiner*—Sara W. Crane
*Assistant Examiner*—Colleen A Matthews

(57) ABSTRACT

This disclosure relates to misalignment-tolerant multiplexing/demultiplexing architectures. One architecture enables communication with a conductive-structure array having a narrow spacing and pitch. Another architecture can comprise address elements having a width substantially identical to that of conductive-structures with which each of these address elements is capable of communicating. Another architecture can comprise rows of co-parallel address elements oriented obliquely relative to address lines and/or conductive structures.

19 Claims, 14 Drawing Sheets

U.S. PATENT DOCUMENTS

| | | | |
|---|---|---|---|
| 6,150,106 A | 11/2000 | Martin et al. | |
| 6,231,744 B1 | 5/2001 | Ying et al. | |
| 6,238,085 B1 | 5/2001 | Higashi et al. | |
| 6,256,767 B1 * | 7/2001 | Kuekes et al. | 716/9 |
| 6,284,979 B1 | 9/2001 | Malozemoff et al. | |
| 6,294,450 B1 | 9/2001 | Chen et al. | |
| 6,355,436 B1 | 3/2002 | Martin et al. | |
| 6,359,288 B1 | 3/2002 | Ying et al. | |
| 6,360,582 B1 | 3/2002 | Chelvayohan et al. | |
| 6,365,059 B1 | 4/2002 | Pechenik | |
| 6,407,443 B2 | 6/2002 | Chen et al. | |
| 6,438,501 B1 | 8/2002 | Szecsody et al. | |
| 6,463,124 B1 | 10/2002 | Weisman | |
| 6,482,639 B2 | 11/2002 | Snow et al. | |
| 6,521,109 B1 | 2/2003 | Bartic et al. | |
| 6,562,577 B2 | 5/2003 | Martin et al. | |
| 6,643,491 B2 | 11/2003 | Kinouchl et al. | |
| 6,680,377 B1 | 1/2004 | Stanton et al. | |
| 6,694,800 B2 | 2/2004 | Weckstrom et al. | |
| 6,747,180 B2 | 6/2004 | Ostgard et al. | |
| 6,924,191 B2 * | 8/2005 | Liu et al. | 438/241 |
| 6,936,891 B2 * | 8/2005 | Saito et al. | 257/331 |
| 2001/0046674 A1 | 11/2001 | Ellington | |
| 2002/0012937 A1 | 1/2002 | Tender et al. | |
| 2002/0061536 A1 | 5/2002 | Martin et al. | |
| 2002/0117659 A1 | 8/2002 | Lieber et al. | |
| 2002/0130353 A1 | 9/2002 | Lieber et al. | |
| 2003/0089899 A1 | 5/2003 | Lieber et al. | |
| 2003/0132461 A1 | 7/2003 | Roesner et al. | |
| 2003/0148562 A1 | 8/2003 | Luyken et al. | |
| 2003/0162190 A1 | 8/2003 | Gorenstein et al. | |
| 2003/0170650 A1 | 9/2003 | Karube et al. | |
| 2003/0186522 A1 | 10/2003 | Duan et al. | |
| 2003/0189202 A1 | 10/2003 | Li et al. | |
| 2003/0219801 A1 | 11/2003 | Lipshutz | |
| 2003/0224435 A1 | 12/2003 | Seiwert | |
| 2004/0005723 A1 | 1/2004 | Empedocles et al. | |
| 2004/0005923 A1 | 1/2004 | Allard et al. | |
| 2004/0007740 A1 | 1/2004 | Abstreiter et al. | |
| 2004/0009510 A1 | 1/2004 | Seiwert et al. | |
| 2004/0028936 A1 | 2/2004 | Kogiso et al. | |
| 2004/0031975 A1 | 2/2004 | Kern et al. | |
| 2004/0041617 A1 | 3/2004 | Snider | |
| 2004/0043527 A1 | 3/2004 | Bradley et al. | |
| 2004/0054978 A1 | 3/2004 | Hogg | |

OTHER PUBLICATIONS

Coleman, et al.; "Percolation-dominated conductivity in a conjugated-polymer-carbon composite" Rapid comunications Physical Review B; vol. 58; No. 12; Sep. 15, 1998, The American Physical Society; pp. RR7492-R7495.

Melosh et al.; "Ultrahigh-Density Nanowire Lattices and Circuits" California Nanosystems Institute University of California Sciencexpress Report.

Covington, et al., "A polymer gate FET sensor array for detecting organic vapours," Sensors and Actuators B 77 Elsevier Science 2001, pp. 155-162.

Butts, "Molecular electronics devices, systems and tools for gigagate, gigabit chips", IEEE/ACM conference, ICCAD 2002, pp. 433-440.

* cited by examiner

US 7,683,435 B2

MISALIGNMENT-TOLERANT MULTIPLEXING/DEMULTIPLEXING ARCHITECTURES

TECHNICAL FIELD

This invention relates to multiplexing/demultiplexing architectures.

BACKGROUND

Electrical communication in and out of an array of thin wires, especially arrays having wires thinner than 1000 nanometers, can be difficult. One reason for this difficulty is that thin wires in arrays are often spaced closely together. This close spacing can make connecting an electrical bond pad with each wire impractical.

One structure for electrically connecting to wires of an array is called a multiplexing/demultiplexing architecture (a "mux/demux architecture"). The mux/demux architecture does not need an electrical bond pad to be connected or aligned with each wire of an array. Instead, one bond pad is typically connected to all of the wires of the array.

This one bond pad does not, however, allow communication with each wire of the array individually. To differentiate between wires, address elements, such as transistors, can be contacted with each of the wires. For a 16-wire array, for instance, four transistors can be contacted with each wire. By selectively turning the transistors on and off, only one of the 16 wires can be permitted to communicate with the one bond pad. Manufacturing this mux/demux architecture is typically less expensive and more reliable than connecting a bond pad to each wire.

In FIG. 1, for instance, an array of wires 102 with wires and spacing well above 1000 nanometers, is electrically connected to one bond pad 104. Wires 106 of the array 102 can be communicated with separately using a binary mux/demux architecture shown at numeral 108. This mux/demux 108 has four different address circuits 110, 112, 114, and 116, each of which communicates with a set of transistors 118 through two address lines. The signals sent to each set of two address lines are complimentary. These address circuits can turn on or off the transistors 118 to which they are connected. By turning the transistors 118 on and off, only one of the wires 106 can be permitted to pass a measurable current from a power supply 120 to the bond pad 104.

For example, a measurable current can travel from the power supply 120 through a third wire 122 (counting from top) to the bond pad 104 only if all four of the transistors 118 that are in contact with the third wire 122 are turned on. The transistors 118 of the third wire 122 are turned on by turning the address circuit 110 on, the circuit 112 on, the circuit 114 off, and the circuit 116 on. When on, the transistors 118 on the "Logical YES" side of each of the address circuits turn on and on the "Logical NOT" side turn off, and vice-versa. Address wires 124, 126, 128, and 130 are used to turn the address circuits 110, 112, 114, and 116 on or off, respectively.

Using this type of mux/demux architecture, a number of address elements (here transistors 118) are used for each wire. This number of elements can increase with higher numbers of wires in an array. For the array 102, which has only 16 wires, four transistors 118 are used for each of the wires 106. For an array having 32 wires, this architecture uses five address elements. For 64 wires, it uses six address elements, for 128 seven, for 256 eight, for 512 nine, and so forth.

Another type of mux/demux includes h-hot architectures. H-hot architectures control wires of an array with a set number (h) of address elements and address wires controlling each wire. For example, if an h-hot mux/demux architecture has m address wires and h address elements on each wire (e.g., transistors), the maximum array size is the combination of h out of m: $(C_m^h)$.

The mux/demux architecture 108 (and typical h-hot architectures) use address elements (like transistors, diodes, and resistors) built using multiple patterned layers and circuit elements (like address lines and wires). Aligning these elements (or layers) with the wires 106 can be accomplished with typical processing machines if the wires 106 of the array 102 are large enough and spaced far enough apart. For narrow wires and spaces, however, the mux/demux architecture 108 may not be able to align the address elements with sufficient accuracy to meet a tolerance of the narrow wires and spaces.

There is, therefore, a need for a system and method capable of communicating with arrays having small wires and spaces that is reliable, less expensive, and/or more production-friendly than permitted by present-day techniques.

BRIEF DESCRIPTION OF THE DRAWINGS

The same numbers are used throughout the disclosure and figures to reference like components and features.

DETAILED DESCRIPTION

This description discloses mux/demux architectures and methods for fabricating them. The described mux/demux architectures comprise h-hot architectures that enable fabrication of address elements in electrical communication with conductive structures of an array at relatively low alignment accuracy. (For additional information on h-hot architectures, see "Decoding of Stochastically Assembled Nanoarrays" by Gojman et al, currently available at http://www.cs.brown.edu/people/jes/decoding nanoarrays.pdf.) How these address elements are oriented with the conductive structures and/or in the array can also enable formation of address lines in electrical communication with these address elements also with relatively low alignment accuracy. Fabrication of the resulting mux/demux architecture is thus enabled at relatively low alignment accuracy.

One process is disclosed that is capable of creating a mux/demux architecture and an array of highly conductive, narrow structures along with the mux/demux architecture. Highly conductive structures in a mux/demux architecture can reduce parasitic voltage drop thereby improving the architecture's and/or array's performance. This process, instead of aligning each address element or group of address elements with conductive structures of an array, forms address elements and conductive structures together so that the address elements are self aligned to the conductive structures. Misalignment in processing of these elements and conductive structures can be tolerated to many multiples of the elements' and/or conductive structures' smallest feature sizes. Because misalignment is tolerated, the address elements and conductive structures can be fabricated with relatively low alignment accuracy (less than 500-nanometer tolerance) processing machines.

Figure 1:
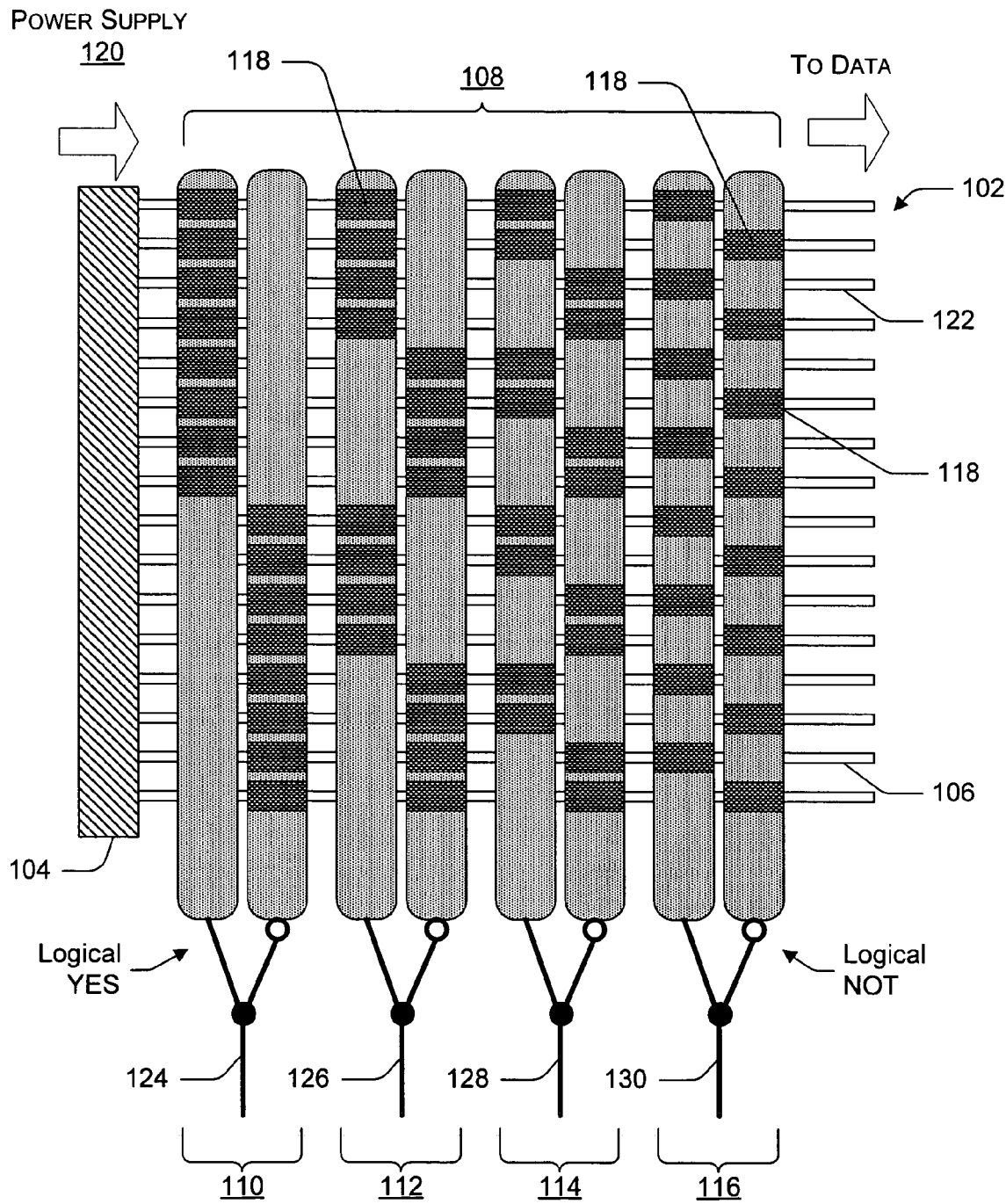
FIG. 1 is a top plan view of a prior-art mux/demux architecture, and is discussed in the "Background" section above.
Figure 2:
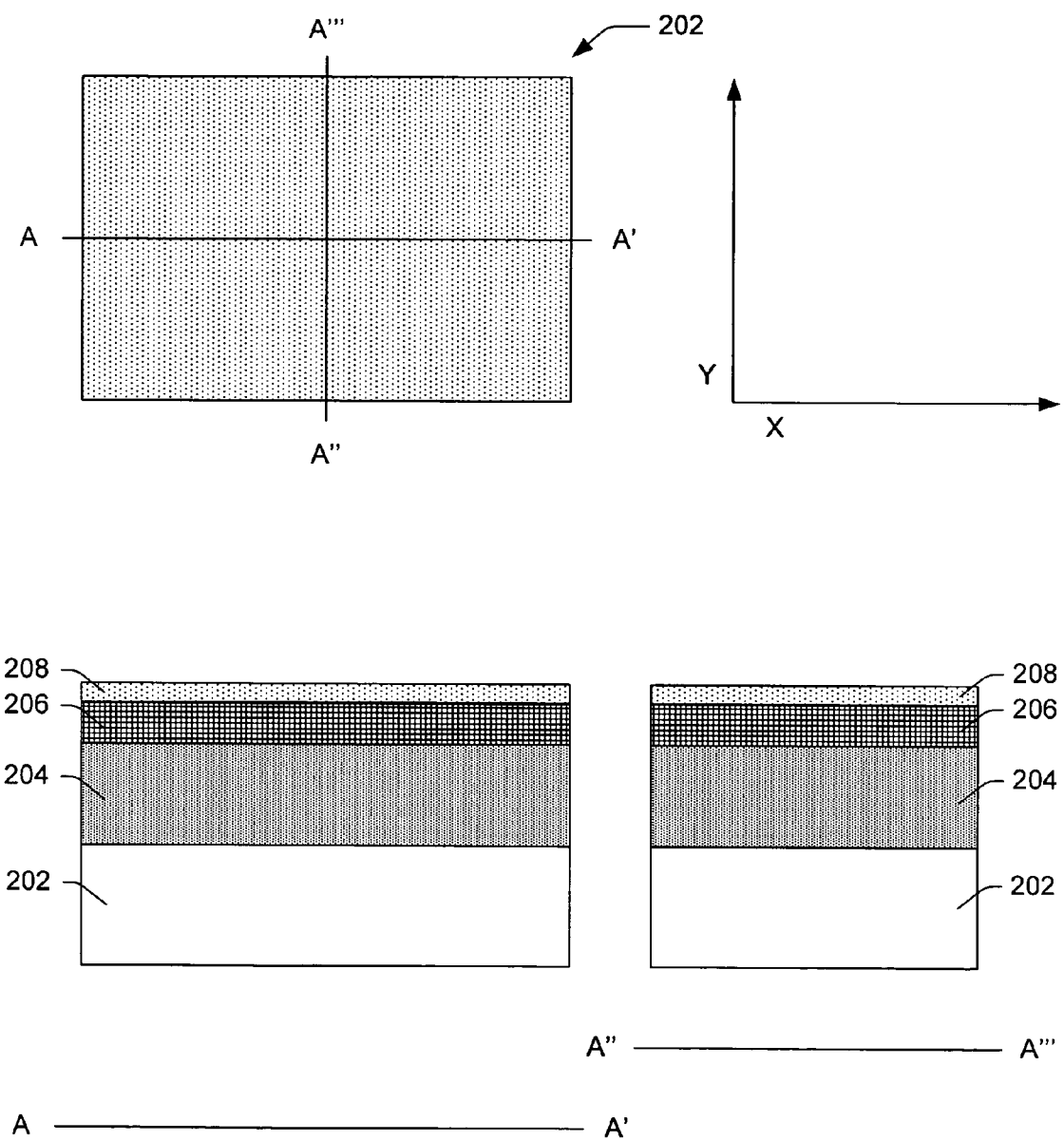
FIG. 2 includes a small top-plan and two side-sectional views taken along lines A-A' and A"-A''' of a substrate.

Referring initially to FIG. 2, various layers of material are formed over a substrate 202. These various layers can comprise an insulative layer 204, such as silicon oxide, and a semiconductive layer 206, such as doped silicon. Over the semiconductive layer 206 a dielectric layer 208, such as silicon oxide, may be formed. In this embodiment the insulative layer 204 is about 2000 angstroms thick, the semiconductive layer 206 is about 300 angstroms thick, and the dielectric layer 208 is about 90 angstroms thick. These materials are formed for fabricating a field-effect-transistor-based mux/demux architecture. Other types of address elements (e.g., active devices) can also be used to form a mux/demux architecture. For a diode-based architecture, for instance, the layer 208 can comprise a semiconductor layer.

Figure 3:
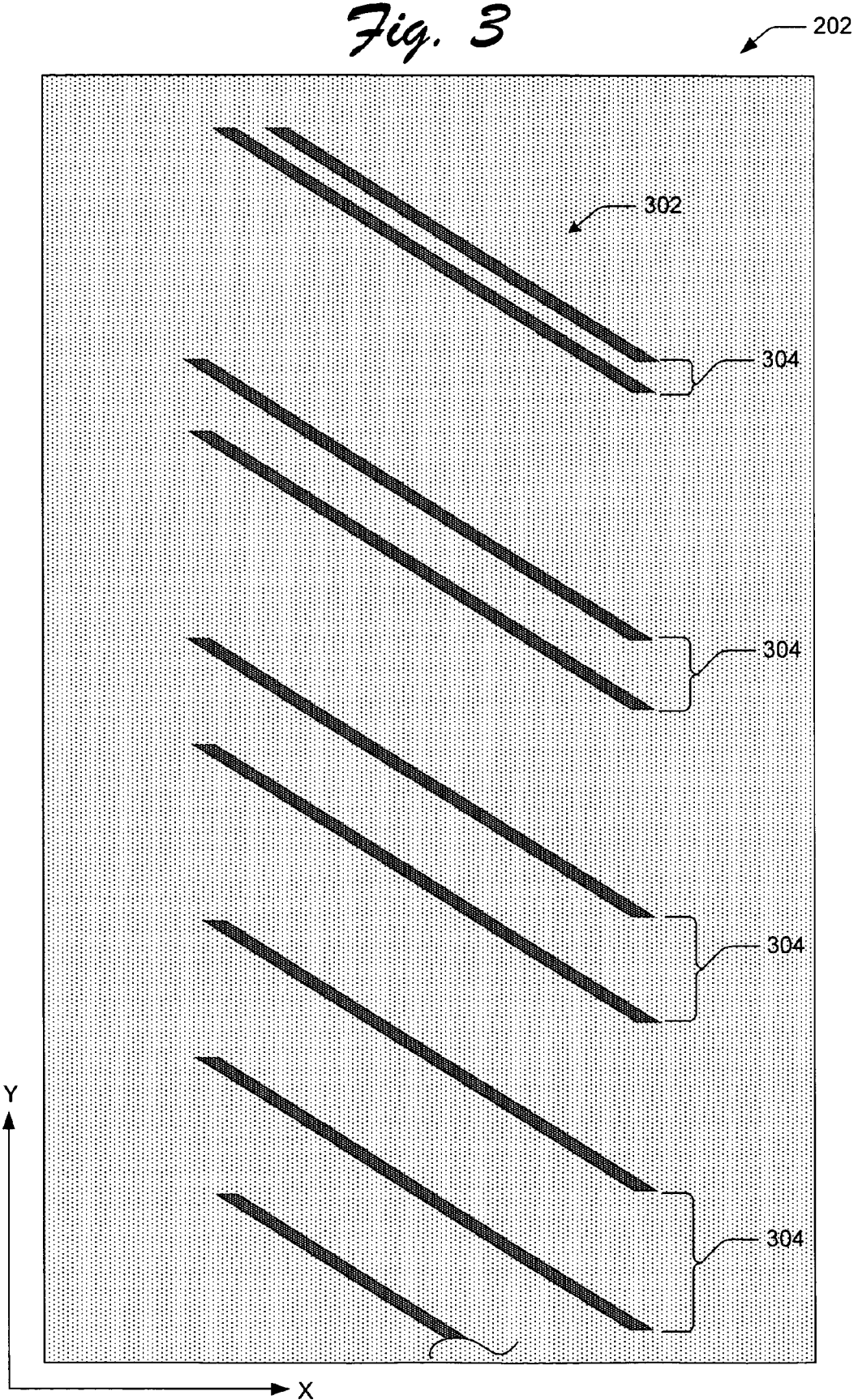
FIG. 3 is a larger top-plan view of the substrate of FIG. 2 atop which a plurality of address-element precursor strips is formed.

Referring to FIG. 3, a pattern of address-element precursor strips 302 (hereinafter the precursor strips 302) are formed over the substrate 202 using standard semiconductor fabrication or nano-scale fabrication techniques. FIG. 3 shows a plurality of the precursor strips 302 to aid in showing one embodiment of their structure and geometric pattern. Cross-sectional and close-up views similar to those shown in FIG. 2 are shown in later figures.

The precursor strips 302 can be formed of materials capable of being further processed or formed into address elements of a mux/demux architecture, such as resistors, diodes, and transistor gates. These materials can include semi-conductors, conductors, insulators, and variable-resistive materials.

The precursor strips 302 are arranged such that co-parallel conductive structures can be made or put into electrical communication with the precursor strips 302 and a majority have a set number of overlaps (e.g., intersections). These co-parallel conductive structures can have a consistent pitch or spacing. These overlaps, which will be discussed further below, can be located at different points along each of the conductive structures, allowing each of the conductive structures to be more easily differentiated with a multiplexing/demultiplexing circuitry.

The precursor strips 302 are configured obliquely relative to the X and Y axes. Later processing of various structures can be performed substantially parallel to the X or Y axis, allowing this oblique angle to provide processing advantages as will become apparent. The precursor strips 302 can be formed at high tolerance when the strips 302 do not have to be aligned with other features, such as when formed over a blank substrate.

As shown in FIG. 3, the precursor strips 302 can be formed having multiple sets of individual, co-parallel strips, shown at numeral 304. These sets 304 comprise two or more strips (here shown with two), the strips spaced differently in each of the sets. A pitch (the spacing plus the width of one of the strips 302) of each of the sets 304 can comprise a pitch of later-formed conductive structures or a multiple of that pitch. This varying spacing and pitch of the strips within sets allows for a consistent overlap with structures oriented along the X axis and other structures oriented along the Y axis, discussed below. This varying space and pitch can, for instance, allow a set number of overlaps with later-formed conductive structures and no duplicative patterns.

Figure 4:
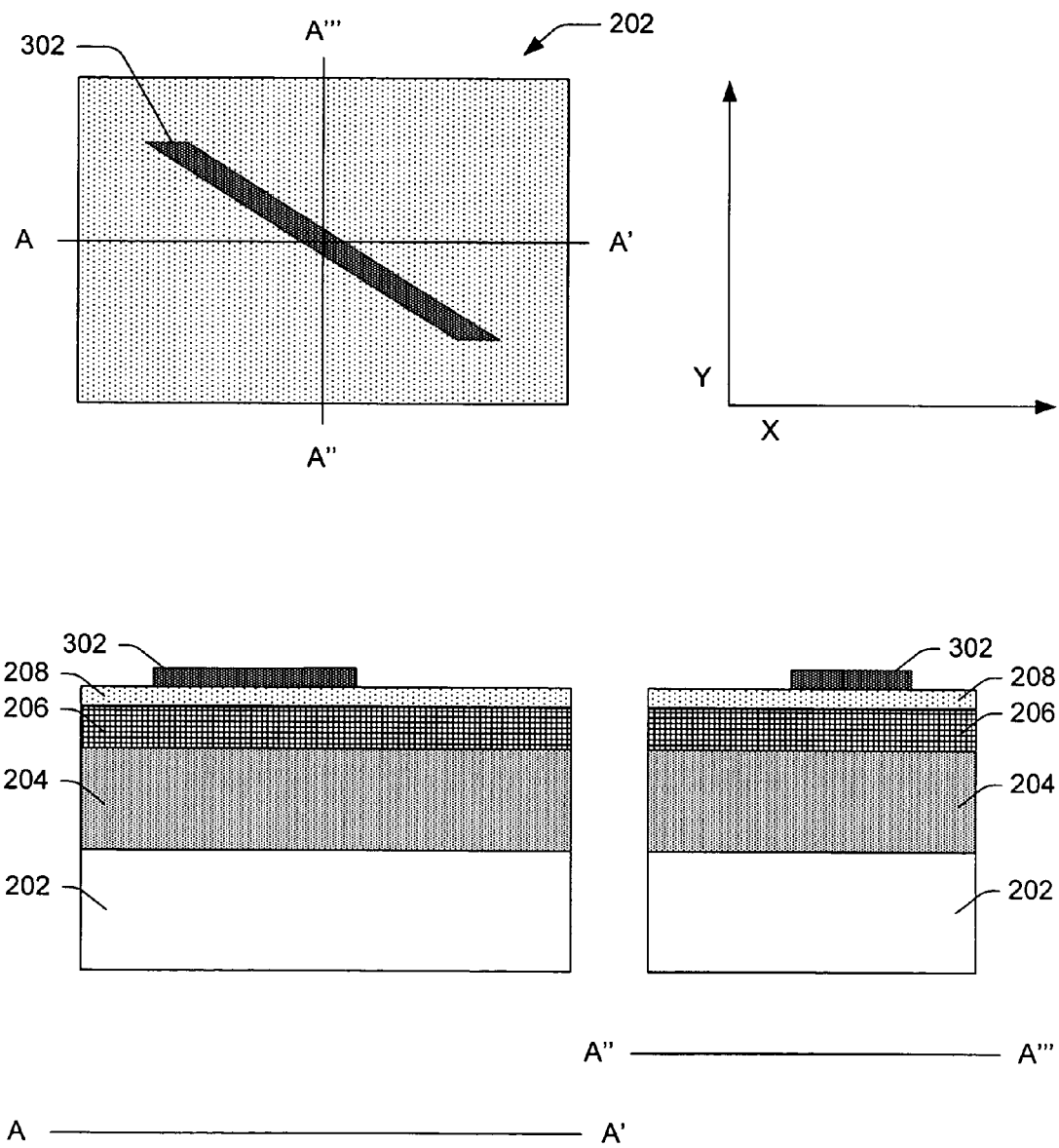
FIG. 4 includes the views of the substrate of FIG. 2 atop which a segment of a single address-element precursor strip is formed.

Referring to FIG. 4, cross-sectional and close-up views of a segment of one of the precursor strips 302 is shown.

In the ongoing embodiment, the precursor strip 302 comprises an address-element precursor formed of a conductive material, such as polysilicon, for later forming into individual transistor gates. To aid in illustrating the ongoing embodiment, the precursor strips 302 are shown at an angle relative to the X axis of about forty degrees. Other angles, however, such as five or ten degrees, can also be formed.

Figure 5:
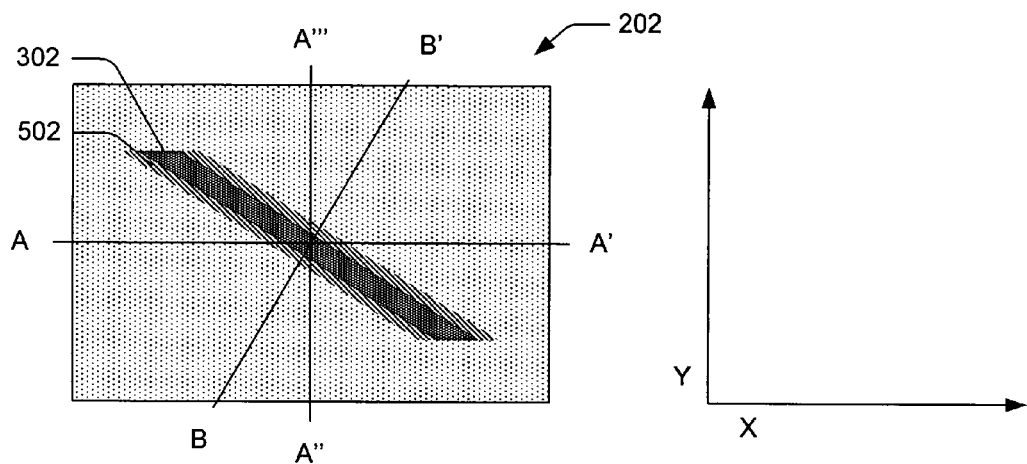
FIG. 5 includes the views of FIG. 4 at a processing step subsequent to that shown by FIG. 4.
Figure 5:
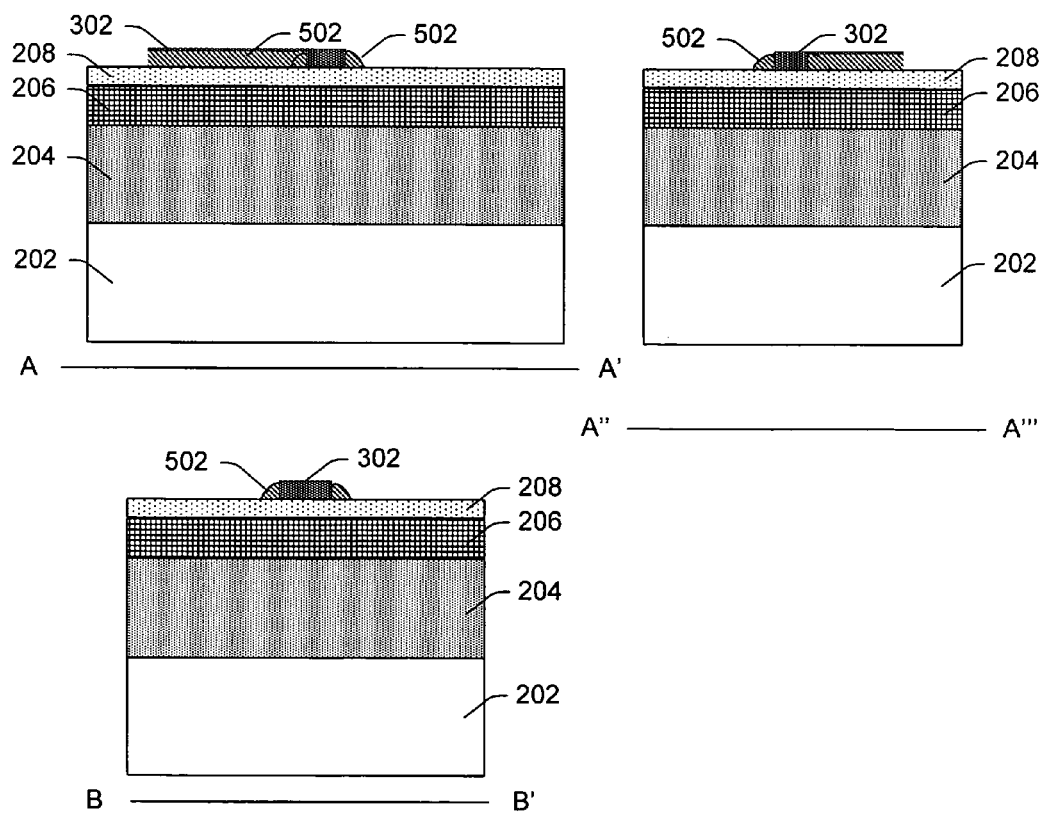

Referring to FIG. 5, spacers 502 are formed. The spacers 502 surround sides of the precursor strips 302. The spacers 502 can be formed with conformal deposition of a layer of spacing dielectric material and anisotropically etching the layer to form the spacers 502 or with other suitable techniques. In this embodiment, the spacers 502 are about thirty nanometers wide and comprise a nitride. An additional side-section is also shown along a line B-B'.

Figure 6:
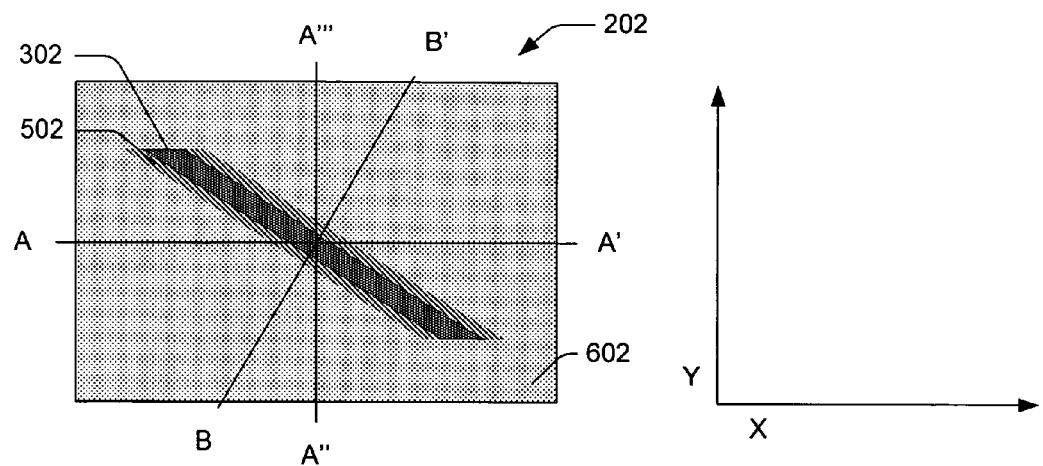
FIG. 6 includes the views of FIG. 5 at a processing step subsequent to that shown by FIG. 5.
Figure 6:
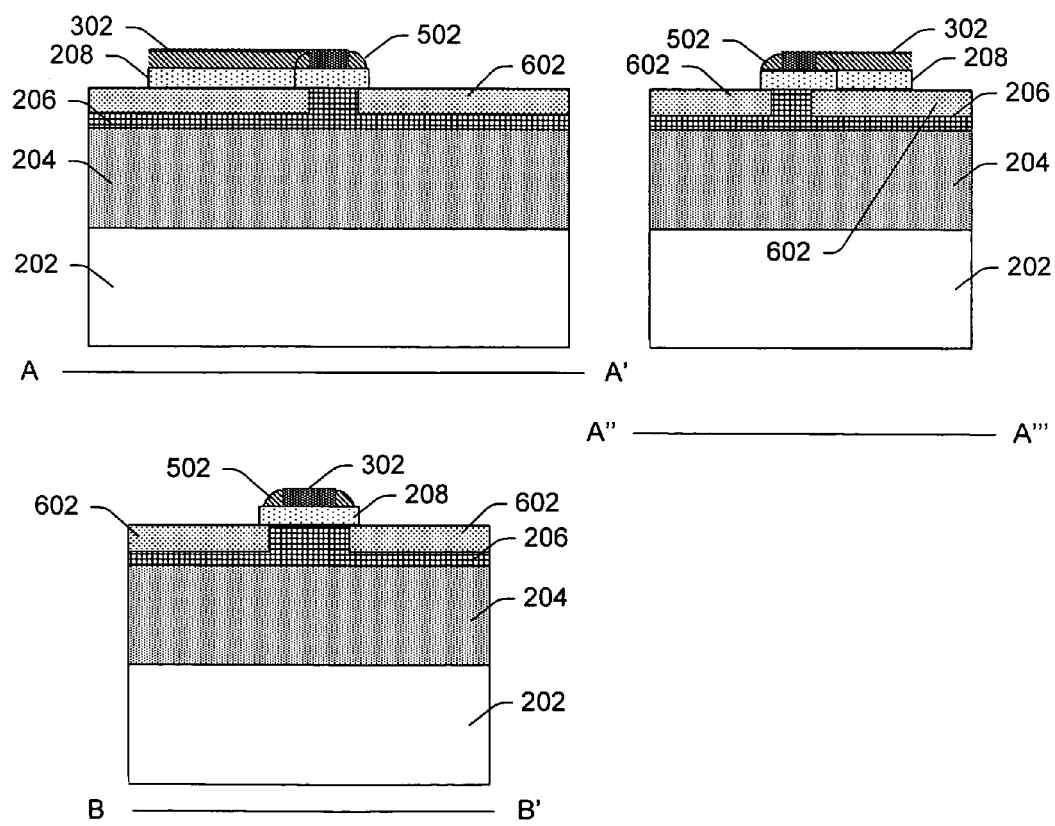

Referring to FIG. 6, source and drain region precursors 602 are formed and part of the dielectric layer 208 is removed. The source and drain region precursors 602 become highly conductive, such as through doping of the semiconductive layer 206 using ion implantation or diffusion or another suitable technique. The source and drain precursors 602 may or may not penetrate through all of the semiconductive layer 206. The precursor strips 302 and the spacers 502 are effective to prohibit doping of an area beneath the precursor strips 302 and the spacers 502, such that the area remains semiconductive. Parts of the dielectric layer 208 are removed using a suitable technique, such as etching. The parts beneath the precursor strip 302 and the spacers 502 are not removed.

Figure 7:
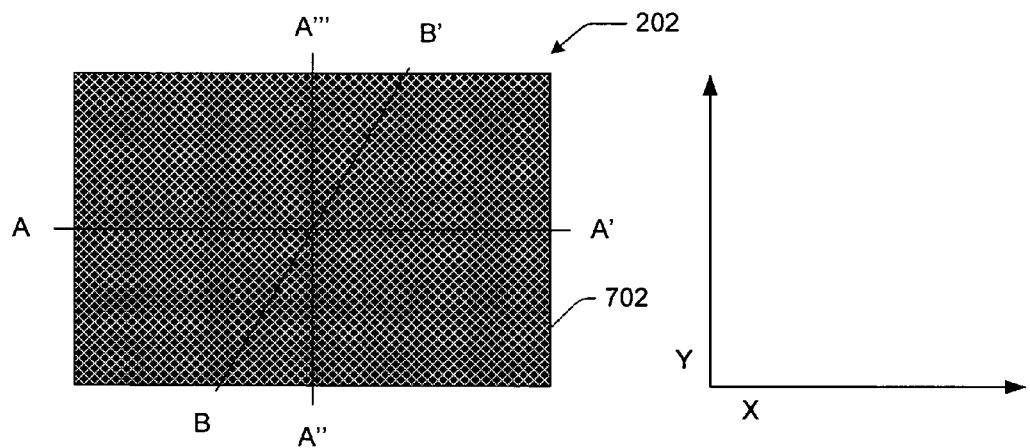
FIG. 7 includes the views of FIG. 6 at a processing step subsequent to that shown by FIG. 6.
Figure 7:
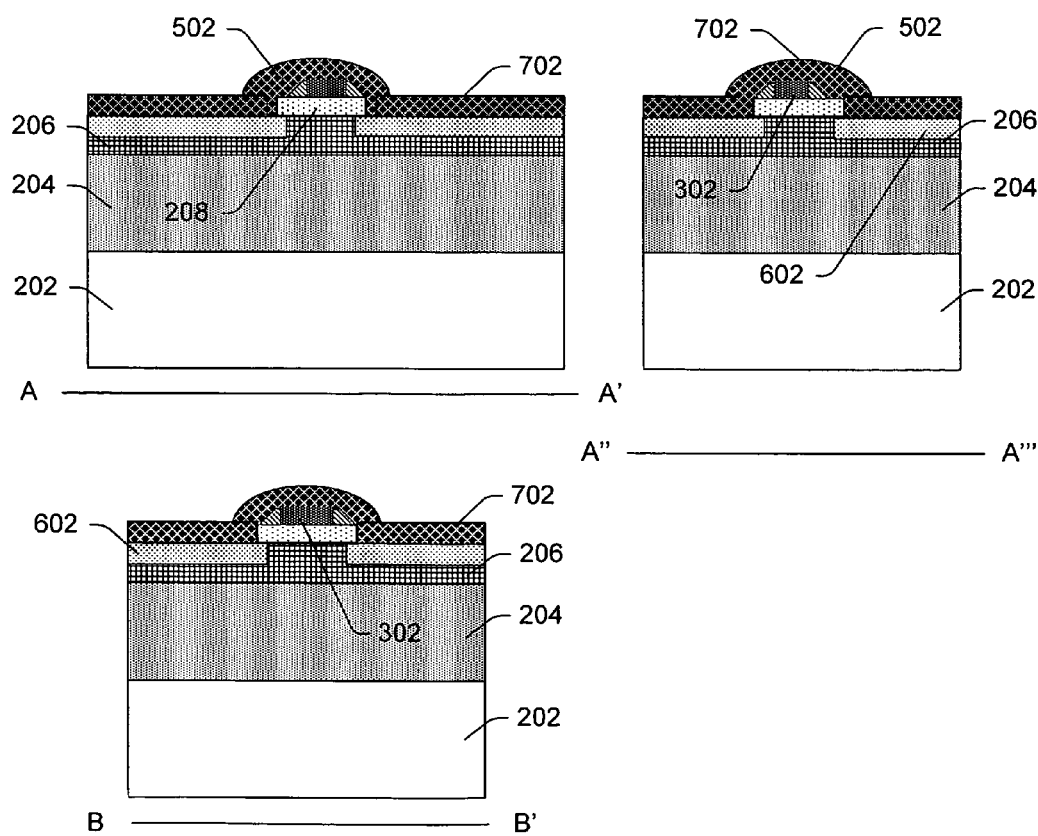

Referring to FIG. 7, a conductive layer 702 is formed over the substrate 202 using sputtering, physical vapor deposition, or another suitable technique. The conductive layer 702 comprises, in the ongoing embodiment, a metal, such as titanium or nickel. Also in the ongoing embodiment, the conductive layer 702 is about twenty nanometers thick and is applied over the substrate 202, here including the strips 302, the spacers 502, and the source and drain region precursors 602.

Figure 8:
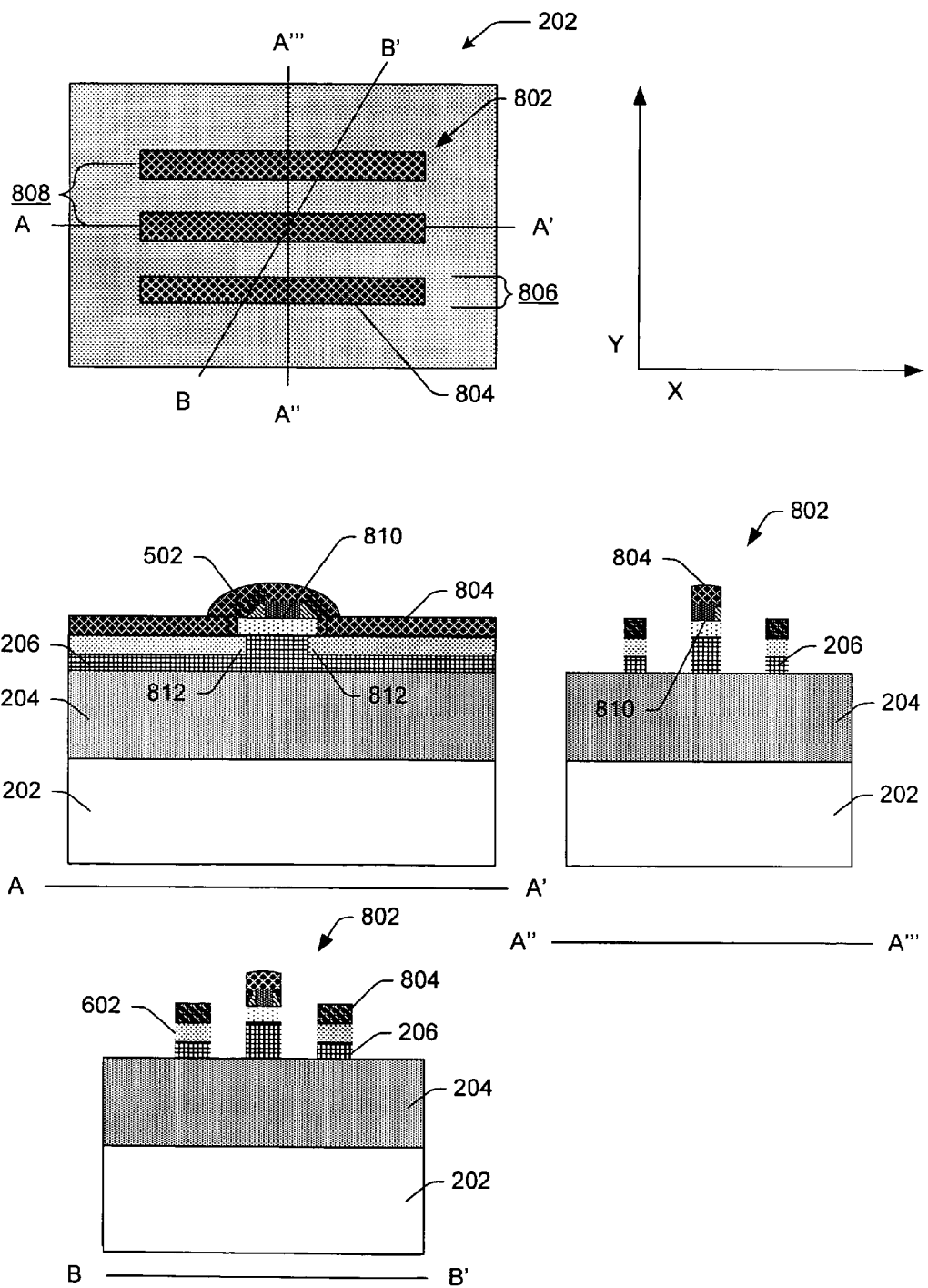
FIG. 8 includes the views of FIG. 7 at a processing step subsequent to that shown by FIG. 7.

Referring to FIG. 8, an array of conductive-structure precursors 802 is formed, such as from the conductive layer 702 by application of a patterned photo-resist layer and then anisotropic plasma etching (not shown) through to the layer 204, or other suitable techniques. The precursor array 802 is partially shown in FIG. 8, here with three conductive-structure precursors 804. For illustration purposes, the view shown along the line B-B' in FIG. 8 shows a clipping plane, rather than a side-section.

This process of patterning removes some of the semiconductive layer 206, the dielectric layer 208, the precursor strips 302, the spacers 502, and the source and drain region precursors 602. In so doing, this forming process can form individual conductive-structure precursors 804 of about one to about 250 nanometers in width 806 and about one to about 500 nanometers in pitch 808. In the ongoing embodiment, the width 806 is about 50 nanometers and the pitch 808 about 100 nanometers. Also in so doing, this forming process can form individual address elements, such as transistor gates, source and drain regions. These individual address elements can have a width substantially similar to a width of the individual conductive-structure precursors 804 with which they overlap. In the ongoing embodiment, individual transistor gates 810 are formed from the precursor strips 302 and source and drain regions 812 from the source and drain region precursors 602. Here the individual transistor gates 810 have a width substantially similar to that of the individual conductive-structure precursors 804.

Figure 9:
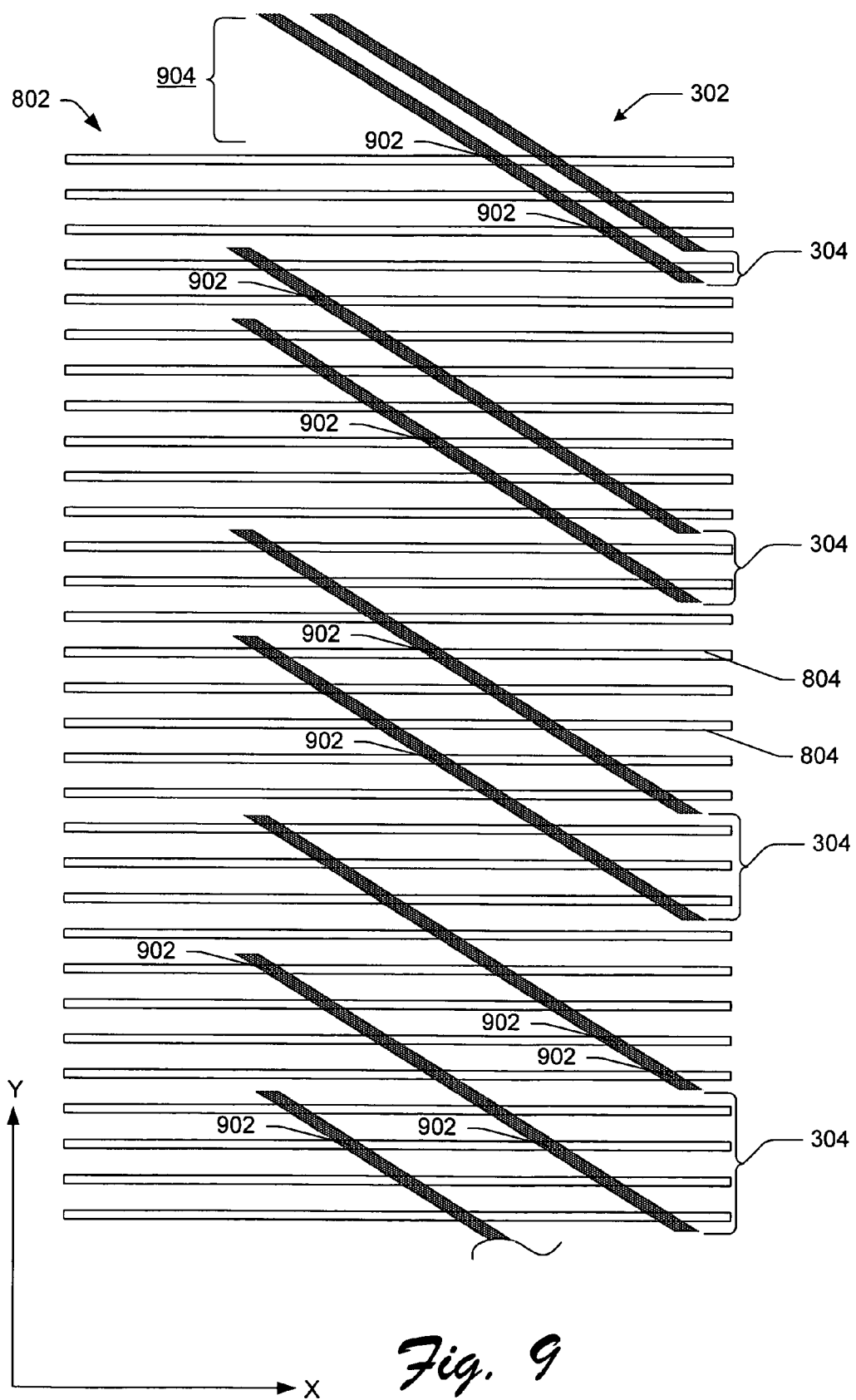
FIG. 9 is a top-plan view of an array of conductive-structure precursors and a plurality of address-element precursor strips, the strips not overlapping with the conductive structures shown not removed.

Referring to FIG. 9, the precursor array 802 of conductive-structure precursors 804 and the precursor strips 302 (but not other structures) are shown to aid in visualizing one embodiment of their structure and geometry. Those parts of the strips 302 not overlapping with the conductive structures 804 are removed in the ongoing embodiment, though they remain shown in FIG. 9 to aid in visualizing the relationship between the array 802 and the strips 302. The conductive-structure precursors 804 are also not shown with the fill-pattern shown in the conductive layer 702 of FIG. 7 or the conductive-structure precursors 804 of FIG. 8, also to aid in visualizing this relationship.

The precursor array 802 is formed at an oblique angle relative to an elongated axis of the precursor strips 302 and/or are generally oriented along the X axis. In this embodiment at least a majority of the conductive-structure precursors 804 overlap a same number (here two) of the precursor strips 302. For additional overlaps, such as three or four, additional strips can be added to each set of strips 304. For communication with an array of conductive-structures having a larger number of conductive-structure precursors 804 (such as 64, 128, 256, 1024, etc.) the precursor strips 302 can also be lengthened along their elongated axis.

In the regions of overlap 902 (some of which are marked), the individual address elements can be formed. This formation can be performed at a high tolerance in the X and Y axes. In the Y axis the tolerance can be many times a pitch 808 of the precursor array 802 (shown in FIG. 8).

In another embodiment, for example, the tolerance is limited only by a number of times the precursor strips 302 repeat. Thus, if the strips 302 are formed with enough strips (such as by repeating a pattern of the strips 302) to be eleven times a Y-dimensional size of the precursor array 802, the precursor array 802 can be formed at a Y-dimensional tolerance of plus or minus about five times the Y-dimensional size of the precursor array 802. If the Y-dimensional size of the precursor array 802 is 500 nanometers, this allows a tolerance of plus or minus about 2500 nanometers. Similarly, by making the number of strips of the precursor strips 302 only twice the size of the Y-dimensional size of the precursor array 802 (an additional 500 nanometers), the tolerance is plus or minus about 250 nanometers.

Figure 10:
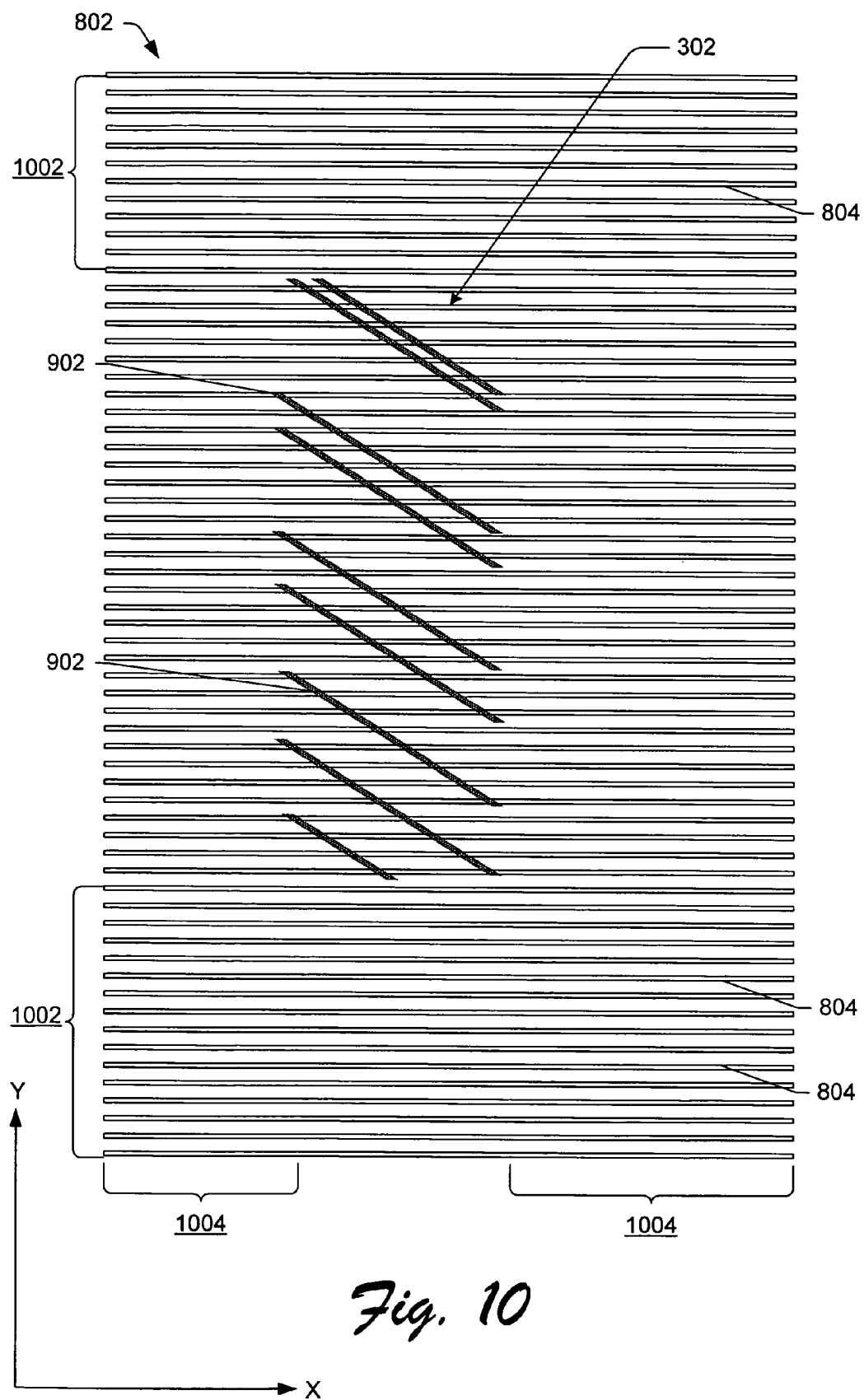
FIG. 10 is a top-plan view of an array of conductive-structure precursors having many unused conductive-structure precursors and a plurality of address-element precursor strips, the strips not overlapping with the conductive structures shown not removed.

Referring to FIG. 10, in still another embodiment, for example, the tolerance is limited only by a number of unused conductive-structure precursors 804 of the precursor array 802. Thus, if the precursor array 802 is intended to provide communication with 32 conductive structures but includes 64 conductive-structure precursors 804, the tolerance along the Y dimension is about plus or minus the unused conductive-structure precursors 804 (here 64−32=32) divided by two and multiplied by the pitch 808 (here 32/2*50 nanometers=800 nanometers).

Similarly, additional length (along the X axis) of the conductive-structure precursors 804 permits additional tolerance in the X axis. Tolerance 1002 and 1004 show an example of the Y and X axis tolerance, respectively, in which the conductive-structure precursor array 802 and/or the precursor strips 302 can be oriented relative to each other.

Figure 11:
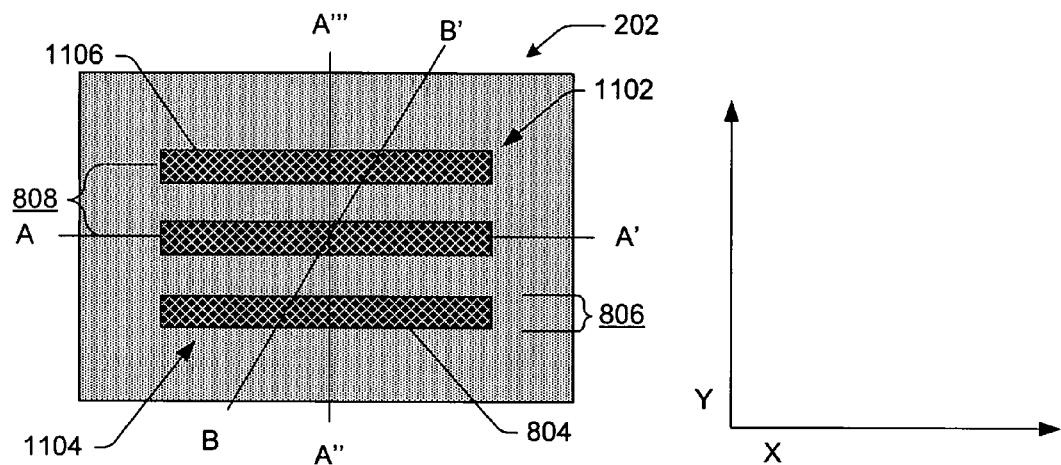
FIG. 11 includes the views of FIG. 8 at a processing step subsequent to that shown by FIG. 8.
Figure 11:
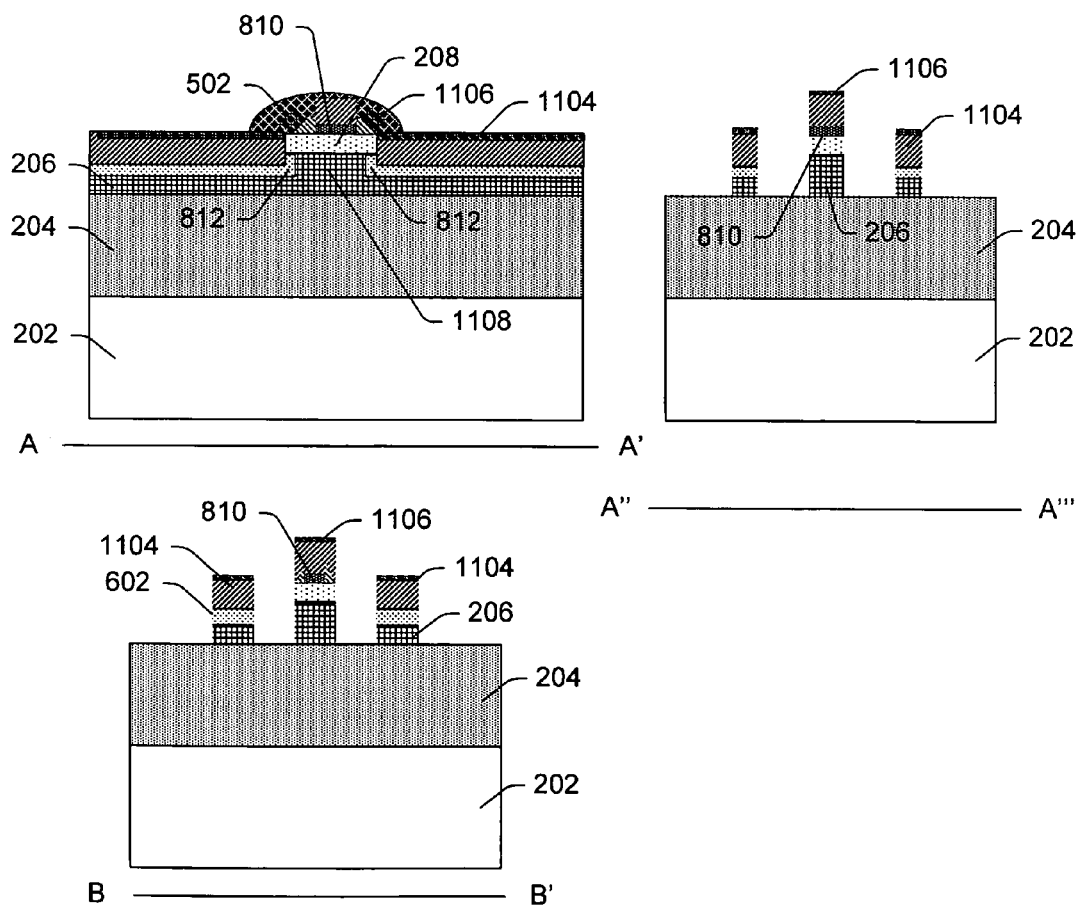

Referring to FIG. 11, an array 1102 of conductive structures 1104 are formed. The array 1102 can be formed from the precursor array 802 by reacting the conductive-structure precursors 804 with adjacent silicon-containing materials, such as by heating the substrate 202 with thermal annealing. Following this, an unreacted remainder 1106 of the conductive-structure precursors 804 can be removed (not shown removed in FIG. 11). Heating can form highly conductive suicide where the conductive structures 804 are in contact with silicon. In this embodiment the conductive structures 804 are in contact with silicon of the semiconductive layer 206 and the source and drain region precursors 602. Here the silicide is formed without penetrating all of the semiconductive layer 206, though it can in other embodiments. As can be appreciated by one skilled in the art, formation of silicide can be formed at other points or in other ways. In one embodiment, for example, silicide is formed from the conductive layer 702 prior to its being patterned as shown in FIG. 8. For illustration purposes, the view shown along the line B-B' in FIG. 11 shows a clipping plane, rather than a side-section.

In the ongoing embodiment, certain parts of the conductive structures 804 and silicon from the semiconductive layer 206 and the doped silicon of the source and drain regions 602 form silicide. If the conductive material layer 702 comprises titanium, a titanium silicide can be formed in the conductive structures 1104. Once the adjacent silicon and conductive material is reacted to form a silicide, the material remaining from the conductive-structure precursors 804 (the unreacted remainder 1106) that is not a silicide is thereby differentiated. The remainder 1106 from the conductive material from the array 802 and the conductive structures 804 is removed, such as by wet etching.

An amount and location of the remainder 1106 can be adjusted using the spacers 502. These spacers 502 can be effective to physically separate the conductive-structure precursors 804 from silicon. In the ongoing embodiment, the dielectric layer 208 comprises silicon dioxide. The spacers 502 are effective to separate the conductive-structure precursors 804 from the individual transistor gates 810. By so doing, the conductive silicide formed is discontinuous at the spacers 502. This discontinuity allows for an address element oriented in the discontinuous region to be used to allow or prevent electrical communication across the conductive structure 1104.

Once the remainder 1106 is removed, the conductive structures 1104 comprise a conductive silicide and a semi-conductive material. This semi-conductive material can comprise the semi-conductive material from the semi-conductive layer 206. In the ongoing embodiment the conductive structure 1104 is conductive but electrically disconnected or capable of being disconnected at a semi-conductive transistor channel 1108.

Figure 12:
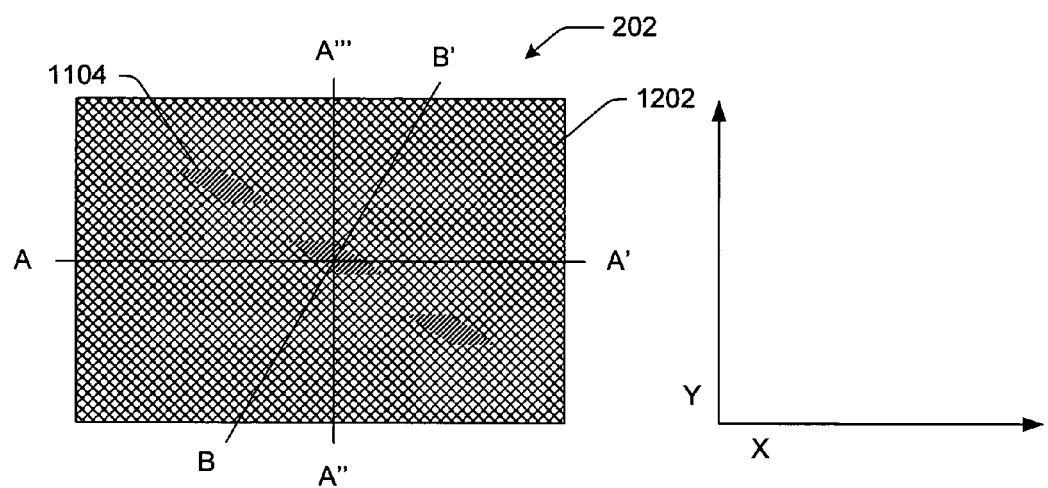
FIG. 12 includes the views of FIG. 11 at a processing step subsequent to that shown by FIG. 11.
Figure 12:
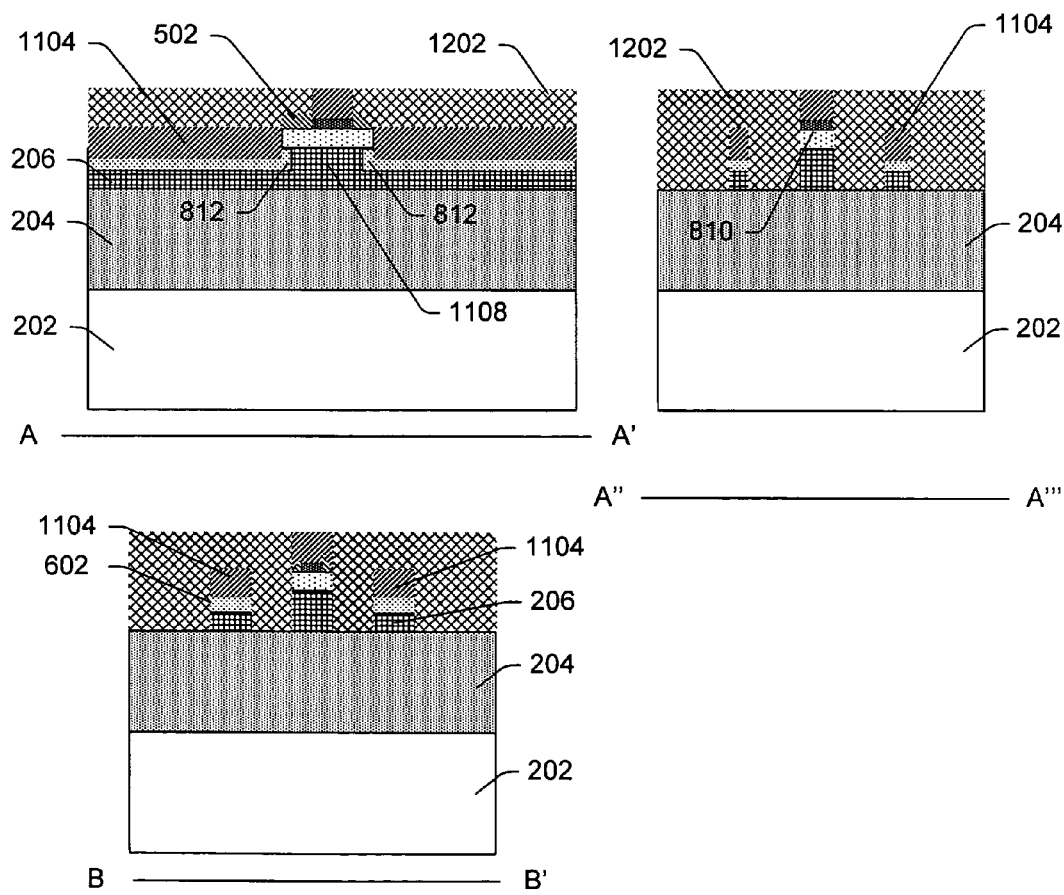

Referring to FIG. 12, the conductive structures 1104 can be electrically isolated except where in communication with the individual transistor gates 810. In the ongoing embodiment, a passivation layer 1202 is formed over the conductive structures 1104 with plasma-enhanced chemical vapor deposition and then partly removed with chemical-mechanical polishing, though other suitable techniques can be used. The passivation layer 1202 comprises an insulative material, such as tetraethylorthosilicate. Also, the remainder 1106 is shown removed in FIG. 12.

Figure 13:
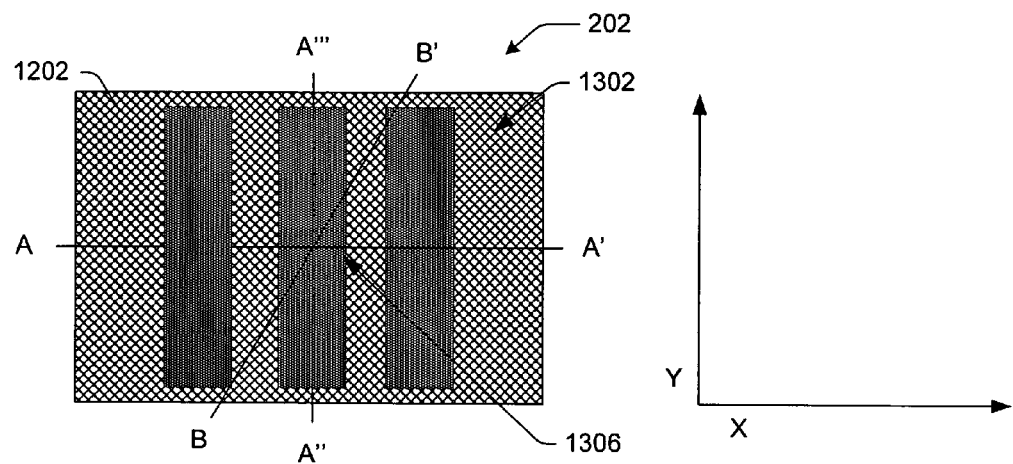
FIG. 13 includes the views of FIG. 12 at a processing step subsequent to that shown by FIG. 12.
Figure 13:
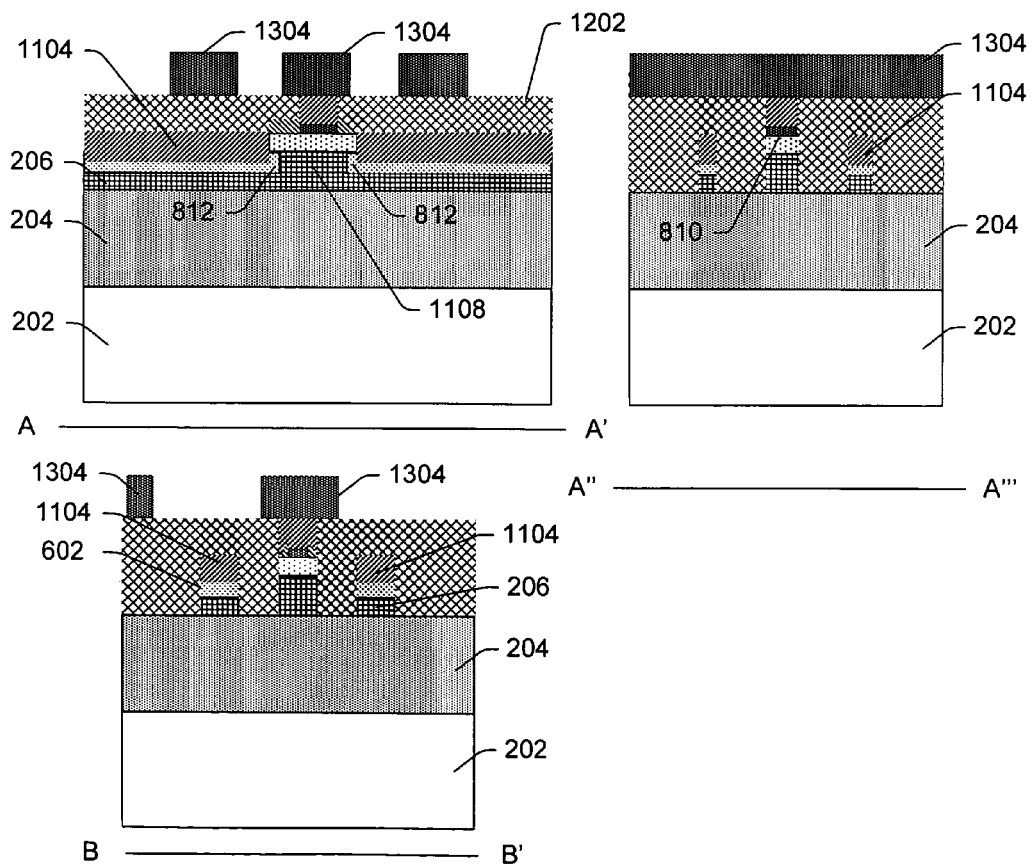

Referring to FIG. 13, an address-line array 1302 of address lines 1304 can be formed over address elements at the regions of overlap 902 with imprint lithography or another suitable technique. This address-line array 1302 can be formed substantially perpendicular the conductive structures 1102 (along the Y axis) or otherwise. Each of the address lines 1304 can be formed to electrically communicate with address elements formed at the regions of overlap 902. An architecture 1306 of the address-line array 1302 and the address elements is effective to provide multiplexing and demultiplexing enabling selective communication with the conductive-structure array 1102. This selective communication can be enabled through each of the address lines 1304 being capable of communicating with certain of the conductive structures 1104 through a single address element near that certain conductive structure 1104. Collectively, the address-line array 1302 enables communication with a majority of the conductively structures 1104. In the ongoing embodiment, a majority of the conductive structures 1104 each communicate with two of the address lines 1304. For illustration purposes, the view shown along the line B-B' in FIG. 13 shows a clipping plane, rather than a side-section.

Figure 14:
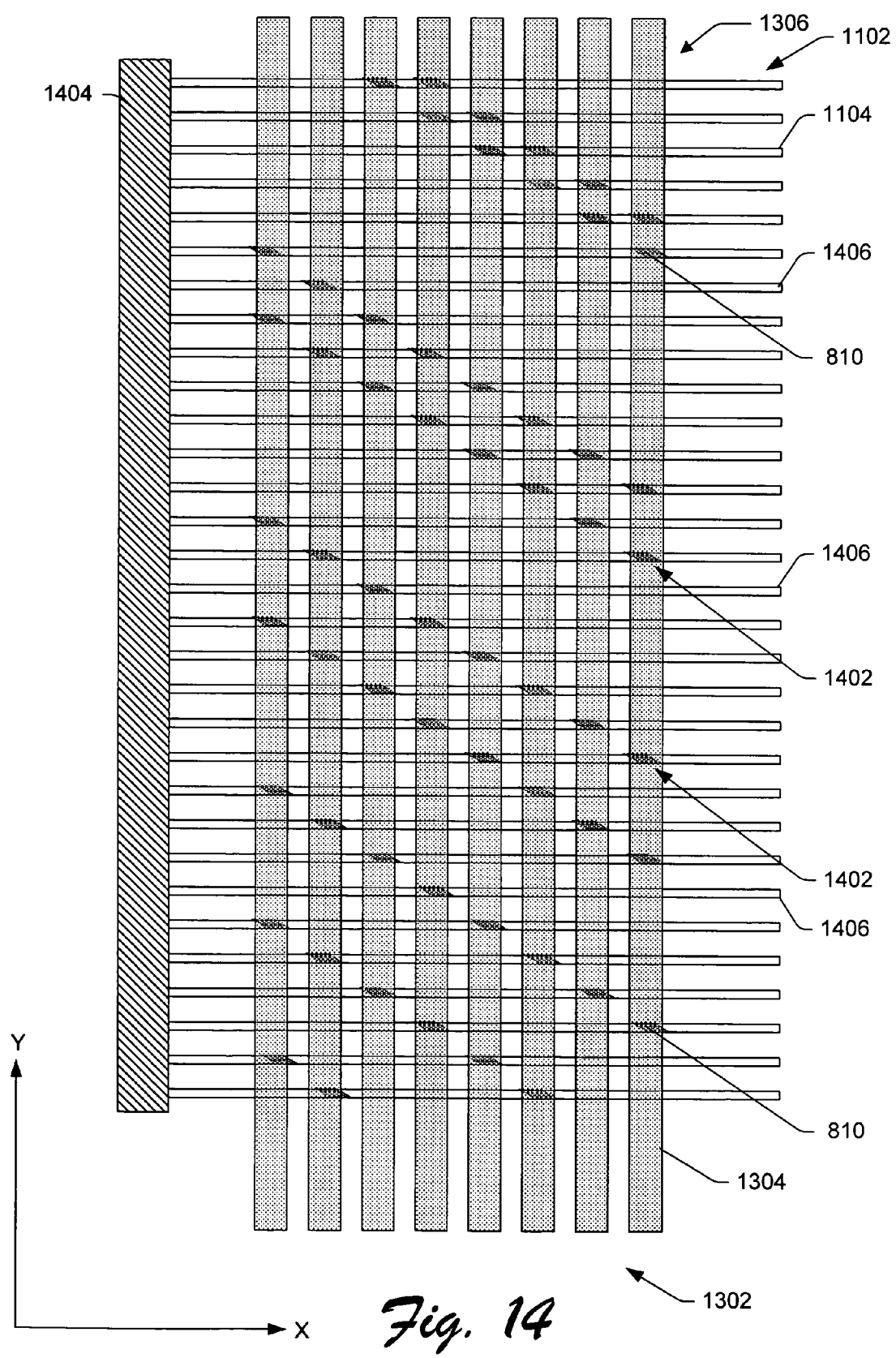
FIG. 14 is a top-plan view of an array of conductive structures and a mux/demux architecture having address elements and address lines.

Referring to FIG. 14, the architecture 1306 and the conductive-structure array 1302 are shown to aid in visualizing one embodiment of the architecture's 1306 structure and geometry. The conductive-structure array 1302 and the architecture 1306 are not shown with the fill-pattern shown in FIG. 13 to aid in visualizing the relationship between the architecture 1306 and the conductive-structure array 1302.

In the ongoing embodiment shown in FIG. 14, the architecture 1306 comprises co-parallel rows 1402 of individual address elements (shown with the transistor gates 810). This orientation provides for every address element of each row 1402 to be capable of electrical communication with only one of the conductive structures 1104. Likewise, every address element of each row 1402 is capable of electrical communication with only one of the address lines 1304.

Also in the ongoing embodiment, the address lines 1304 are formed to electrically communicate with the transistor gates 810. By selectively providing current through various address lines 1304, one of the individual conductive structures 1104 can be communicated with through an electrical connection 1404. In this embodiment the address lines 1304 are about 500 nanometers wide and comprise aluminum.

A majority or substantially all of the conductive structures 1104 can comprise a same number of address elements. A minority 1406 of the conductive structures 1104 can also not comprise the same number of address elements as the majority.

In the ongoing embodiment, the minority 1406 of the conductive structures 1104 do not comprise the same number of address elements as the majority. The conductive-structure precursors 804 associated with this minority 1406 did not overlap as many of the precursor strips 302, and thus the minority 1406 do not comprise as many address elements. The minority conductive structures 1406, for instance, comprise only one address element, while other conductive structures 1104 comprise two address elements. These structures 1406 also may alternate at a regular interval, in this embodiment they are (counted from the top of the page) the seventh, sixteenth, and twenty-fifth conductive structures of the conductive-structure array 1102. These minority conductive structures 1406 may be unused, thereby acting as dummy lines. Or, some of the precursor strips 302 can be extended (not shown) to permit these minority conductive structures 1406 to instead have a same number or higher number of address elements than the other conductive structures 1104. If the precursor strips 302 are extended to increase the number of address elements at these minority conductive structures 1406, additional address lines (not shown) can be formed to control them. These minority conductive structures 1406 may be effective to indicate locations of address elements on the majority of the conductive structures 1104. To indicate locations of address elements on the majority of the conductive structures 1104, additional address lines (not shown) can be formed in communication with the minority conductive structures 1406.

While the ongoing embodiment of the method for fabricating the architecture 1306 shows two transistor gates for a majority of the conductive structures 1104, both the method and the architecture 1306 can also enable three, four, five, or more address elements for a majority of the conductive structure 1104. In this embodiment the address elements comprise transistors, though diodes, resistors, and the like can also be formed.

Although the invention is described in language specific to structural features and methodological steps, it is to be understood that the invention defined in the appended claims is not necessarily limited to the specific features or steps described. Rather, the specific features and steps disclosed represent exemplary forms of implementing the claimed invention.

What is claimed is:

1. A system comprising:
an array of parallel conductive structures;
parallel rows of address elements disposed over said conductive structures, each said row being formed from a single precursor strip in a plurality of parallel precursor strips disposed obliquely to said array of conductive structures, in which adjacent address elements in each said row correspond to the intersection of said single precursor strip with adjacent conductive structures in said array, at least a majority of the conductive structures being in electrical communication with a same number of the address elements; and
wherein the array of conductive structures is arranged perpendicular to address lines, which are in electrical communication with the conductive structures through the address elements; and
wherein a spacing between adjacent rows of address elements varies.

2. The system of claim 1, wherein the address elements comprise transistors having transistor gates and each of the transistor gates has a width substantially identical to a width of the conductive structure with which the address element communicates.

3. The system of claim 1, wherein the rows comprise sets of adjacent rows each having rows differently spaced from the other sets.

4. The system of claim 1, wherein the same number of the address elements comprises two.

5. The system of claim 1, wherein the same number of the address elements comprises at least three.

6. The system of claim 1, wherein the array generally has a pitch between the conductive structures of about one to about 500 nanometers.

7. A system comprising:
- an array of conductive structures having a width and pitch from about one to about 250 nanometers; and
- a multiplexing/demultiplexing architecture having address lines and address elements, wherein the address lines are in electrical communication with the conductive structures through the address elements, and wherein the address elements are arranged in rows, each said row being formed from a single precursor strip in a plurality of parallel precursor strips disposed obliquely relative to the conductive structures and the address lines, in which adjacent address elements in each said row correspond to the intersection of said single precursor strip with adjacent conductive structures in said array, such that at least a majority of the conductive structures are in electrical communication with a same number of the address elements.

8. The system of claim 7, wherein each address element of each row is capable of electrical communication with only one of the conductive structures.

9. The system of claim 7, wherein each address element of each row is capable of electrical communication with only one of the address lines.

10. The system of claim 7, wherein the multiplexing/demultiplexing architecture is effective to provide individual electrical communication with each of the conductive structures.

11. The system of claim 7, wherein the multiplexing/demultiplexing architecture is effective to provide individual electrical communication with each of the conductive structures that is in electrical communication with two or more of the address elements.

12. The system of claim 7, wherein the address elements comprise transistors.

13. The system of claim 7, wherein the address elements comprise transistors having a gate with a width substantially identical to a width of the conductive structure with which each of the transistors is electrically communicable.

14. The system of claim 7, wherein the address elements comprise resistors.

15. The system of claim 7, wherein the address elements comprise diodes.

16. The system of claim 7, wherein the conductive structures comprise a silicide.

17. The system of claim 7, wherein the conductive structures are semi-conductive at the address elements.

18. The system of claim 7, wherein a majority of the address lines are in electrical communication with a same number of address elements, but a number of address elements in electrical communication with each address line varies.

19. The system of claim 18, wherein the majority comprises substantially all of the address lines.

* * * * *